(12) United States Patent  (10) Patent No.: US 8,247,085 B2
Bewlay et al.                (45) Date of Patent:     Aug. 21, 2012

(54) OXIDE-FORMING PROTECTIVE COATINGS FOR NIOBIUM-BASED MATERIALS

(75) Inventors: Bernard Patrick Bewlay, Niskayuna, NY (US); Pazhayannur Ramanathan Subramanian, Niskayuna, NY (US); Joseph David Rigney, Milford, OH (US); Richard DiDomizio, Scotia, NY (US); Voramon Supatarawanich Dheeradhada, Latham, NY (US)

(73) Assignee: General Electric Company, Niskayuna, NY (US)

( * ) Notice: Subject to any disclaimer, the term of this patent is extended or adjusted under 35 U.S.C. 154(b) by 777 days.

(21) Appl. No.: 12/275,785

(22) Filed: Nov. 21, 2008

(65) Prior Publication Data

US 2011/0146848 A1    Jun. 23, 2011

(51) Int. Cl.
 *B32B 15/00*    (2006.01)
 *C22C 30/00*    (2006.01)

(52) U.S. Cl. ..... 428/662; 420/428; 420/588; 416/241 R; 416/241 B; 428/469; 428/472

(58) Field of Classification Search .................. 428/632, 428/472, 615, 641, 651, 660, 662; 420/588, 420/426, 425; 148/422, 442; 416/241 R, 416/241 B
See application file for complete search history.

(56) References Cited

U.S. PATENT DOCUMENTS

| 3,046,109 | A | * | 7/1962 | Lottridge, Jr. | ................ 420/426 |
| 5,330,590 | A | | 7/1994 | Raj | |
| 5,368,813 | A | | 11/1994 | Hobbs et al. | |
| 5,472,487 | A | * | 12/1995 | Chin et al. | ................ 106/287.11 |
| 5,683,524 | A | | 11/1997 | Subramanian et al. | |
| 5,721,061 | A | | 2/1998 | Jackson et al. | |
| 5,741,376 | A | | 4/1998 | Subramanian et al. | |
| 5,942,055 | A | * | 8/1999 | Jackson et al. | ................ 148/422 |
| 6,428,910 | B1 | * | 8/2002 | Jackson et al. | ................ 428/660 |
| 7,189,459 | B2 | | 3/2007 | Jackson et al. | |

\* cited by examiner

*Primary Examiner* — Timothy Speer
*Assistant Examiner* — Daniel J Schleis
(74) *Attorney, Agent, or Firm* — Penny A. Clarke

(57) ABSTRACT

Coatings suitable for use as protective oxide-forming coatings on Nb-based substrates exposed to high temperatures and oxidative environments. The coatings contain chromium and/or molybdenum, preferably contains silicon, and optionally contains niobium, titanium, hafnium, iron, rhenium, tantalum, and/or tungsten, which in combination form multiple intermetallic phases, which in combination form one or more intermetallic phases that promote the formation of a slow-growing oxide scale. Depending on the particular coating composition, the intermetallic phases may be: a silicon-modified $Cr_2Nb$ Laves phase and optionally a chromium solid solution phase, a CrNbSi intermetallic phase, and/or an $M_3Si$ intermetallic phase where M is niobium, titanium, and/or chromium; or $M_5Si_3$, $MSi_2$ and/or $M_3Si_2$ where M is molybdenum, niobium, titanium, chromium, hafnium, iron, rhenium, tantalum, and/or tungsten.

9 Claims, 6 Drawing Sheets

OXIDE-FORMING PROTECTIVE COATINGS FOR NIOBIUM-BASED MATERIALS

BACKGROUND OF THE INVENTION

This invention generally relates to coatings suitable for protecting components exposed to high-temperature environments, such as the hot gas flow path through a gas turbine engine. More particularly, this invention is directed to coatings that impart oxidation resistance to niobium-based materials, including niobium-based alloys and niobium-silicide composites.

Higher operating temperatures for gas turbine engines are continuously sought in order to increase their efficiency. While nickel, cobalt and iron-base superalloys have found wide use for components within the hot sections of gas turbine engines, alternative materials have been proposed to achieve improved high-temperature properties. For example, refractory metal alloys and intermetallic materials have been proposed as candidates for high temperature applications, such as blades, nozzles, vanes, shrouds, afterburner components, and other hot gas path components of gas turbine engines. Examples include monolithic refractory metal alloys and refractory metal intermetallic composite (RMIC) materials, including alloys based on niobium, titanium, hafnium and zirconium. A notable example of an RMIC is niobium silicide (Nb—Si) alloys, which may further contain other alloying constituents, including titanium, hafnium, aluminum, chromium, etc. Nb-based RMICs usually have a microstructure containing a metallic Nb-base phased and one or more intermetallic phases, for example, an intermetallic niobium-silicide (NbSi) phase that forms during solidification of the alloy. The niobium-based phase is relatively ductile, while the intermetallic phase is brittle and stronger to contribute strength, fracture toughness and other desirable mechanical properties. In contrast to niobium silicide alloys and other Nb-based RMICs, monolithic Nb-based alloys (as the term is used herein) are essentially free of strengthening phases such as silicides and other intermetallic phases.

The above-noted compositions are termed Nb-based in that their predominant constituent is niobium; in other words, the material contains more niobium than any other individual constituent. Depending on the particular composition, niobium-based alloys and RMICs can have much greater temperature capabilities than existing nickel, cobalt, and iron-based superalloys.

Nb-based RMICs and monolithic Nb-based alloys have become of particular interest for replacing superalloys in the hot sections of turbine engines because they are capable of possessing a promising combination of low-temperature mechanical properties, such as room temperature toughness, as well as high-temperature strength and creep resistance. However, a significant impediment to the development of Nb-based alloys and RMICs for high-temperature applications in aircraft engines is their oxidation resistance. Existing nickel, cobalt, and iron-based superalloys exposed to high-temperature oxidation environments are often protected with an oxidation-resistant coating that forms a protective oxide film during high temperature exposure in air. The oxide film, commonly referred to as an oxide scale and often an aluminum oxide (alumina, $Al_2O_3$) or chromium oxide (chromia, $Cr_2O_3$), inhibits oxidation of the coating and the underlying substrate. Nb-based materials intended for use in high-temperature oxidizing environments have been protected with oxidation-resistant coatings, for example, Si—Cr—Ti and Si—Cr—Fe silicide coatings, to improve their oxidation resistance. These coatings are interdiffused and form a large diffusion zone. The oxide scale formed by these coating compositions is a complex oxide that does not always exhibit a slow parabolic mass gain with time, represented by the equation:

$$(\Delta m)^2 = k_p t$$

where $\Delta m$ is the specific weight increase, t is time, and $k_p$ is a kinetic constant (always positive).

In an effort to provide improved coatings that exhibit a lower oxide growth rate, a significant body of work has been directed at using aluminum interdiffusion to produce a Nb—Al compound capable of forming a protective alumina scale. However, the sustained formation of alumina scale has not been achieved in these attempts, and to date aluminum-based coatings suitable for protecting Nb alloys has not been practical.

Another result of the interdiffusion process used to form Si—Cr—Ti or Si—Cr—Fe coatings is that a significant number of vertical cracks form in the coating, often in excess of one hundred vertical cracks per inch, when formed on Nb—Si composites. These cracks are termed "vertical" because they extend through the interdiffused coating in a direction that is roughly perpendicular to the coating/substrate interface. FIG. 3 shows three cross-sections of a Nb-based substrate coated with a Si—Cr—Fe coating commercially known as R512E (by weight, about 60Si-20Cr-20Fe), in which cracks are visible and extend from the coating surface all the way into the substrate material, creating a path through which the substrate material is directly exposed to the oxidative environment. Oxides that form in the vertical cracks during high temperature exposure cause the cracks to wedge open, increasing the depth of the cracks into the substrate. As also shown in FIG. 3, with sufficient exposure time the cracks may be deflected at the coating/substrate interface and run along the interface, producing a wedging effect between the coating and substrate. Ultimately, the coating spalls because the crack-opening effect caused by oxidation exposes the substrate material directly to the oxidative environment.

Vertical cracks in Si—Cr—Ti or Si—Cr—Fe coatings are due in part to the interdiffused coating having a significantly larger coefficient of thermal expansion (CTE) than the substrate material, for example, 50% higher or more. The high CTEs of the Si—Cr—Ti and Si—Cr—Fe coatings are attributable to the silicides that form during the interdiffusion process, for example, $Ti_5Si_3$ (CTE of about 11.5 ppm/° C.), $TiSi_2$ (CTE of about 12 ppm/° C.), and $CrSi_2$ (CTE of about 14 ppm/° C.), whose CTEs are significantly greater than that of Nb—Si materials (about 8.5 ppm/° C.). A CTE difference between the coating and substrate of less than 10% would be desirable for reducing and potentially eliminating vertical crack formation.

In view of the above, coating compositions and methods are desired for coatings capable of improving the high temperature performance of Nb-based materials, including monolithic Nb alloys and Nb—Si alloys.

BRIEF DESCRIPTION OF THE INVENTION

The present invention provides a coating suitable for use as a protective oxide-forming coating on Nb-based substrates, and particularly Nb-based surfaces of articles exposed to high temperatures and oxidative environments, including the hostile environment of a gas turbine engine. Examples of Nb-based substrate materials include but are not limited to monolithic niobium-based alloys and niobium-based RMICs, the latter of which includes niobium-silicide (Nb—Si) composites.

According to one aspect of the invention, a coating is provided that is capable of promoting the oxidation resistance of a surface of a niobium-based substrate, such as a monolithic niobium-based alloy. The coating is an overlay or diffusion coating that contains chromium and/or molybdenum, preferably contains silicon, and optionally contains niobium, titanium, hafnium, iron, rhenium, tantalum, and/or tungsten, which in combination form multiple intermetallic phases. A first preferred composition for the coating contains chromium, silicon, niobium, and optionally hafnium and/or titanium, and the coating contains a silicon-modified $Cr_2Nb$ Laves (intermetallic) phase and optionally a chromium solid solution phase, a CrNbSi intermetallic phase, and/or an $M_3Si$ intermetallic phase where M is niobium, titanium, and/or chromium. A second preferred composition for the coating contains molybdenum, silicon, and at least one of niobium, titanium, chromium, hafnium, iron, rhenium, tantalum, and tungsten, and the coating has an $M_5Si_3$ matrix containing intermetallic phases comprising at least one of $MSi_2$ and $M_3Si_2$ where M is molybdenum, niobium, titanium, chromium, hafnium, iron, rhenium, tantalum, and/or tungsten.

According to another aspect of the invention, the coating may be formed by an overlay process followed by a heat treatment, or formed by a diffusion process. If the coating is the first composition, the process is preferably an overlay deposition technique that deposits a chromium-containing layer on the substrate, optionally followed by a heat treatment. If the coating is the second composition, the process may entail an overlay deposition technique that deposits a molybdenum-containing layer on the substrate, optionally followed by a heat treatment, or may entail a solid-state or liquid-state diffusion technique by which molybdenum is diffused into the substrate.

According to still another aspect of the invention, a gas turbine engine component is provided having a substrate formed of a niobium-based material, such as a monolithic niobium-based alloy or a niobium-based composite material. A coating formed of one of the two above-noted compositions is provided on the substrate surface to promote the oxidation resistance of the substrate. Finally, an oxide scale is present on a surface of the coating.

A significant advantage of this invention is that the coating compositions are capable of significantly improving the oxidation resistance of components formed of Nb-based substrates, and particularly monolithic niobium-based alloys. Coatings formed according to the first composition form a continuous chromia-containing complex oxide scale that exhibits enhanced chemical compatibility with niobium-based substrate materials. In addition to forming an oxide scale that exhibits a desirable slow parabolic mass gain with time, coatings formed of the second composition have CTEs that are closer to that of niobium-based materials than prior art Si—Cr—Ti and Si—Cr—Fe coatings, and as a result these coatings develop far fewer vertical cracks.

Other objects and advantages of this invention will be better appreciated from the following detailed description.

DETAILED DESCRIPTION OF THE INVENTION

Figure 1:
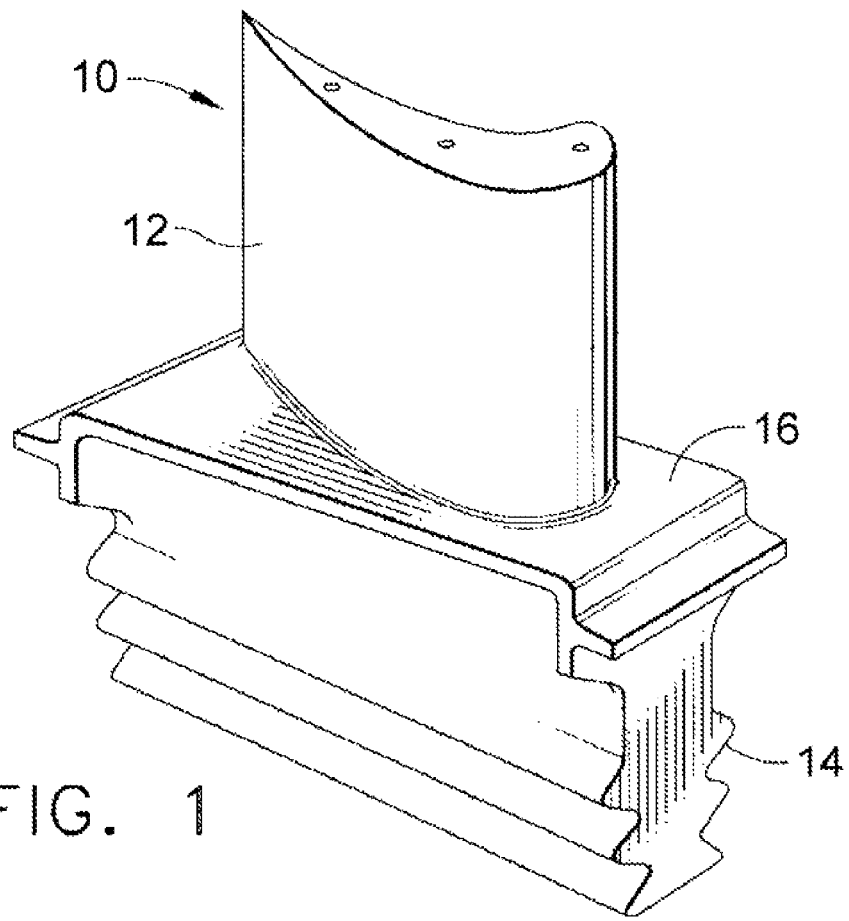
FIG. 1 shows a turbine blade of a gas turbine engine, and is representative of gas turbine engine components that can be formed of niobium-based materials.

The present invention is generally applicable to components that operate within environments characterized by relatively high temperatures and subjected to severe oxidation. Notable examples of such components include blades, nozzles, vanes, shrouds, afterburner components, and other components within the hot gas flow path of gas turbine engines. One such example is the high pressure turbine blade 10 shown in FIG. 1. The blade 10, which is typically in the form of a casting, generally includes an airfoil 12 against which hot combustion gases are directed during operation of the gas turbine engine, and whose surface is therefore subjected to severe attack by oxidation, corrosion and erosion. A platform 16 separates the airfoil 12 from a dovetail 14 formed on a root section of the blade 10, by which the airfoil 12 is anchored to a turbine disk (not shown). While the advantages of this invention will be described with reference to the turbine blade 10 shown in FIG. 1, the teachings of this invention are generally applicable to other components on which a coating system is desired to protect the component from its environment.

Figure 2:
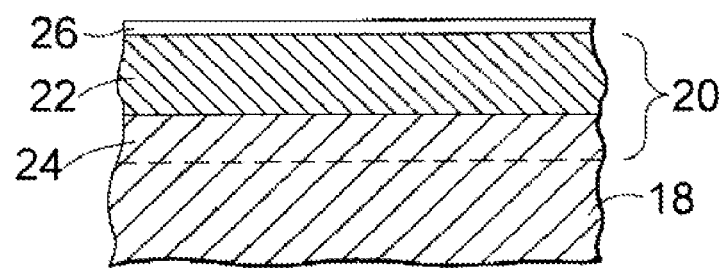
FIG. 2 schematically represents a fragmentary cross-sectional view of a surface region of the blade of FIG. 1, and shows a protective coating on a surface of the blade in accordance with this invention.

A surface region 18 of the blade 10 is represented in FIG. 2 for purposes of illustrating the invention. The blade 10, or at least its surface region 18, is preferably formed of a niobium-based material, such as a monolithic niobium-based alloy, though other niobium-based alloys or niobium-based RMIC materials are also within the scope of the invention. As shown in FIG. 2, the surface region 18 of the blade 10 is protected by a coating 20. The coating 20 may define the outermost surface of the blade 10, or may be overcoated with additional coatings, including a thermal barrier coating. The coating 20 provides environmental protection to the underlying surface region 18, thereby enabling the blade 10 to survive within higher temperature environments than otherwise possible. An optional outer coating, such as a thermal barrier coating (TBC) or environmental barrier coating (EBC), may overlay the coating 20 to provide additional thermal and/or environmental protection for the blade 10.

According to a particular aspect of the invention, the coating 10 is specially formulated for protecting substrates formed of monolithic niobium-based alloys and niobium silicide composites. Generally, monolithic Nb-based alloys of particular interest to the invention may contain, by weight, up to 5% aluminum, up to 1% carbon, up to 5% cobalt, up to 20% chromium, up to 5% iron, up to 10% hafnium, up to 3% manganese, up to 15% molybdenum, up to 0.2% silicon, up to 30% tantalum, up to 20% titanium, up to 8% vanadium, up to 15% tungsten, and up to 10% zirconium, up to 5% of a rare earth element, up to 25% of a platinum group metal, the balance niobium and incidental impurities. The inclusion and amounts used of any of these elements will depend on a variety of factors, such as the desired properties for the final alloy product, and generally all such compositions are within the scope of the invention.

Aside from monolithic Nb-based alloys of particular interest to the invention, other Nb-based materials of interest include niobium-based RMICs reinforced with an intermetallic phase, specific examples of which include Nb—Si alloys having a microstructure containing a niobium-silicide strengthening phase (and optionally other intermetallic silicide phases) within a metallic Nb-based matrix phase. Examples of notable NbSi RMICs are disclosed in U.S. Pat. No. 5,833,773 to Bewlay et al., U.S. Pat. No. 5,932,033 to Jackson et al., U.S. Pat. No. 6,409,848 to Bewlay et al., U.S. Pat. No. 6,419,765 to Jackson et al., U.S. Pat. No. 6,676,381 to Subramanian et al., U.S. Pat. No. 6,913,655 to Jackson et al., and U.S. Pat. No. 7,296,616 to Bewlay et al., and U.S. Published Patent Application No. 2006/0042725 to Bewlay et al. The contents of these patent documents relating to niobium-based materials, including their compositions and processing, are incorporated herein by reference. The amount and composition of the silicide phase within the NbSi alloy can vary significantly, as described in U.S. Published Patent Application No. 2006/0042725 to Bewlay et al. The silicide phase may be, for example, $M_3Si$ or $M_5Si_3$, where M is Nb, Ti, and/or Hf, depending on the particular composition of the alloy. The microstructure of the alloy may contain other phases as well, including Laves (intermetallic) phases such as $Cr_2Nb$.

The coating 20 is represented in FIG. 2 as having an overlay region 22 on the surface of the region 18, and a limited diffusion zone 24 that extends into the surface region 18. As discussed below, the presence and extent of the diffusion zone 24 will depend on the particular coating composition and processing of the coating 20. The coating 20 is further represented as having developed an oxide scale 26 that promotes the oxidation resistance of the coating 20 and the underlying surface region 18. The oxide scale 26 inherently grows from the compositions of the coating 20, but can also be promoted by appropriate thermal processing of the coating 20.

The coating 20 can be deposited by a number of processes. If deposited as an overlay coating, an overlay deposition process is used, for example, physical vapor deposition (PVD), air plasma spray (APS), vacuum plasma spray (VPS), low pressure plasma spray (LPPS), high velocity oxy-fuel (HVOF), high velocity air-fuel (HVAF), ion plasma deposition (IPD), and/or sputtering, which form what is termed herein an "overlay" coating with minimal interdiffusion with the surface region 18. A heat treatment can be performed following deposition to homogenize and interdiffuse the deposited overlay coating 20, thereby promoting phase formation/stabilization and intimate contact with the surface region 18. A limited diffusion zone 24 develops during such a heat treatment, while the overlay region 22 of the coating 20 predominantly retains its as-deposited composition. For certain compositions, other diffusion coating processes may be used, for example, pack cementation, chemical vapor deposition (CVD), halide-assisted pack cementation, above-the-pack halide-assisted deposition, and slurry deposition processes, resulting in what is termed herein a "diffusion" coating having a more pronounced diffusion zone 24. As the terms are used in the art, diffusion coatings 20 of this invention can be distinguished from overlay coatings 20 of this invention, in that the diffusion coatings 20 significantly interact with the surface region 18 during deposition as a result of extensive interdiffusion with the region 18, during which various intermetallic and metastable phases may form within the region 18 as a result of diffusional gradients and changes in elemental solubility in the local region of the substrate.

The coating 20 may be deposited to contain chromium and/or molybdenum, preferably silicon and/or hafnium, and optionally additional elements such as niobium, titanium, iron, rhenium, tantalum, tungsten, etc. In combination, the elements of the coating 20 form specific intermetallic phases identified by this invention as capable of promoting the formation of a continuous oxide scale 26 that exhibits a slow parabolic mass gain with time, and in at least one embodiment also promotes the crack resistance of the coating 20. Two compositions are discussed below as having been shown to achieve these aspects of the invention.

A first of the compositions (Composition A) for the coating 20 is specifically formulated to have a chemistry that enables the coating 20 to form a complex and, to some extent self-sustaining, oxide scale 26 that provides passivation of the coating surface. The complex oxide scale 26 contains chromia ($Cr_2O_3$) and, depending on the particular composition of the coating 20, may further contain titania ($TiO_2$), niobia ($Nb_2O_5$), and/or silica ($SiO_2$), and possibly others. Coatings 20 formed of Composition A contain a silicon-modified $Cr_2Nb$ Laves phase (for example, $(Cr,Si)_2Nb$) as their predominant phase or matrix within their overlay region 22 and/or diffusion zone 24, depending on the processes used to deposit and form the coating 20. Depending on the particular constituents and their levels in Composition A, phases of the coating 20 may further include a chromium solid solution phase, a CrNbSi intermetallic phase, and/or an $M_3Si$ intermetallic phase, where M is niobium, titanium, and/or chromium, and optionally additional alloying elements of the coating 20, such as hafnium, zirconium, tungsten, tin, aluminum, germanium, iron, and/or tantalum. When present in proper volume fractions, the phases of Composition A have been shown to form a continuous oxide scale 26 capable of imparting oxidation resistance to the niobium-based surface region 18 (and other niobium-based alloys and composites, especially Nb—Si composites), extending the life of the blade 10 during high temperature operating conditions. Prolonged component life is also enhanced by the chemical compatibility of Composition A with Nb-based substrate materials.

The ability of the coating 20 to form a complex oxide scale 26 is attributed to the types and approximate relative amounts (by volume percent) of the phases in the coating 20, as summarized in Table I below. The predominant silicon-modified $Cr_2Nb$ Laves phase can be formed by the diffusion of chromium into the surface of a NbSi-based substrate, such as by one of the above-noted deposition and diffusion processes. To achieve greater control over the amount of Laves phase, and particularly to obtain the amounts of phases identified for Composition A in Table I, one of the previously-noted overlay deposition processes is preferably used to deposit chromium and other constituents of the coating 20 in amounts that may form in situ the phases in the specified amounts. Following deposition, the coating 20 can be heat treated to homogenize the overlay coating 20 to ensure phase formation/stabilization. Preferred heat treatments also cause sufficient diffusion of the overlay coating 20 into the surface region 18 of the substrate to ensure intimate contact with the surface region 18 (and, if necessary, form the desired intermetallic phases of the coating 20, i.e., within the diffusion zone 24), but without significantly altering the composition of the overlay region 22 of the coating 20. A suitable treatment is to hold the coated substrate at a temperature of about 1250° C. to about 1350° C.

for a duration of about one to about ten hours in a non-oxidizing atmosphere such as a flowing inert gas (for example, argon), a vacuum, etc.

TABLE I

| Phases | Broad Ranges | Preferred Ranges | Nominal Values |
|---|---|---|---|
| Laves phase | at least 72% | 75 to 100% | 85% |
| Cr solid solution | up to 28% | 5 to 25% | 10% |
| CrNbSi | up to 28% | 5 to 25% | 3% |
| $M_3Si$ | up to 25% | 0 to 25% | 2% |

Also within the scope of the invention are the ternary and higher order variations of the intermetallic phases, including the solid solutions of these phases with Nb, Ti, Ta, W, Sn, Fe, Mo, Hf, Zr, Al, Ge, Re, Sc, Y, Ce, Tb, La, Eu, Er, Nd, Sm, Gd, Pr, Dy and other rare-earth elements.

Approximate preferred chemistries (by atomic percent) of the above phases are summarized in Table II below.

TABLE II

|  | $Cr_2Nb$ Broad | $Cr_2Nb$ Pref. | Cr s.s. Broad | Cr s.s. Pref. | $M_3Si$ Broad | $M_3Si$ Pref. | CrNbSi Broad | CrNbSi Pref. |
|---|---|---|---|---|---|---|---|---|
| Cr | 42-68 | 55-62 | 93-100 | 94-100 | 65-80 | 68-80 | 29-37 | 31-35 |
| Nb | 15-30 | 19-22 | 0-7 | 0-5 | 0.1-10 | 0.1-10 | 30-37 | 31-35 |
| Si | 1-30 | 1-11 | 0-5 | 0-2 | 18-28 | 19-28 | 30-37 | 31-35 |
| Ti | — | — | 0-7 | 0-5 | 0.1-10 | 0.1-10 | — | — |
| Cr + Nb | — | — | — | — | 66-80 | 66-80 | — | — |
| Nb + Ti | 25-35 | 29-35 | 0-7 | 0-5 | — | — | — | — |
| Si + Ge | 1-30 | 1-13 | — | — | — | — | — | — |
| Hf | 0.5-5 | 0.5-3 | — | — | — | — | — | — |
| Al | — | — | 0-5 | 0-2 | — | — | — | — |
| W | — | — | 0-5 | 0-2 | — | — | — | — |

The silicon-modified $Cr_2Nb$ Laves phase may also contain in solid solution any one or more of Ti, Ta, W, Sn, Fe, Mo, Hf, Zr, Al, Ge, Re, Sc, Y, Ce, Tb, La, Eu, Er, Nd, Sm, Gd, Pr, Dy and other rare-earth elements.

The optional chromium solid solution phase may also contain in solid solution any one or more of Ta, Sn, Fe, Mo, Hf, Zr, Ge, Re, Sc, Y, Ce, Tb, La, Eu, Er, Nd, Sm, Gd, Pr, Dy and other rare-earth elements.

The optional CrNbSi intermetallic phase may also contain in solid solution any one or more of Ta, W, Sn, Fe, Hf, Zr, Al, Ge, Re, Sc, Y, Ce, Tb, La, Eu, Er, Nd, Sm, Gd, Pr, Dy and other rare-earth elements.

The optional $M_3Si$ intermetallic phase may also contain in solid solution any one or more of Ti, Ta, W, Sn, Fe, Mo, Hf, Zr, Al, Ge, Re, Sc, Y, Ce, Tb, La, Eu, Er, Nd, Sm, Gd, Pr, Dy and other rare-earth elements.

Approximate coating chemistries (by atomic percent) for coatings 20 having the phases and amounts specified in Tables I and II are summarized in Table III below. Silicon is available in Nb—Si composite substrates for interdiffusion with the coating 20, and therefore may not be a required constituent of the as-deposited coating material. For this reason, the chemistries summarized in Table III for Composition A can be obtained by depositing and optionally interdiffusing a coating material that contains intentional additions of silicon on a silicon-free substrate, as well as depositing and interdiffusing a coating material that does not contain intentional additions of silicon on a silicon-containing substrate (such as a Nb—Si composite).

TABLE III

| Constituents | Broad Ranges | Preferred Ranges | Nominal Values |
|---|---|---|---|
| Chromium | 31 to 99% | 55 to 75% | 65% |
| Niobium | 0 to 40% | 10 to 30% | 27% |
| Silicon | 1 to 37% | 5 to 20% | 8% |

For the above chemistries, titanium, hafnium, and iron can be added as desirable yet optional constituents of the coating 20. Titanium may be present in an amount of up to about 30 atomic percent. If titanium is present, niobium and titanium are preferably present in a combined amount of up to 40 atomic percent. Niobium and titanium may also be combined with hafnium and iron in a combined amount of up to 40 atomic percent. The addition of hafnium is particularly beneficial for promoting the chemical compatibility of the coating 20 with Nb-based alloy substrates and Nb—Si composite substrates, as well as reducing degradation due to interdiffusion. Additions of titanium and iron are beneficial for promoting the oxidation resistance of the coating 20.

Other potential alloying constituents, including zirconium, tungsten, tin, aluminum, germanium, tantalum, molybdenum, rhenium, scandium, yttrium, cerium, terbium, lanthanum, europium, erbium, neodymium, samarium, gadolinium, praseodymium, dysprosium, and other rare-earth elements may be present in a combined amount of up to about 5 atomic percent, preferably less than 2.5 atomic percent.

In investigations leading to Composition A, several Nb—Si composites and coating compositions were prepared and evaluated. The first (AF02) of three specimens was not coated for use as a baseline, and the two remaining specimens (SM21 and SM22) were coated by sputtering chromium to form an overlay coating having a thickness of about 15 and about 20 micrometers, respectively. All three specimens underwent heat treatment at about 1300° C. for about two hours. All three specimens then underwent a cyclic oxidation test conducted at about 1150° C. for a duration of about three hundred hours.

Figure 4:
FIG. 4 shows a scanned image of a cross-section through a Nb-based substrate having an as-deposited chromium coating in accordance with an embodiment of the invention.
Figure 5:
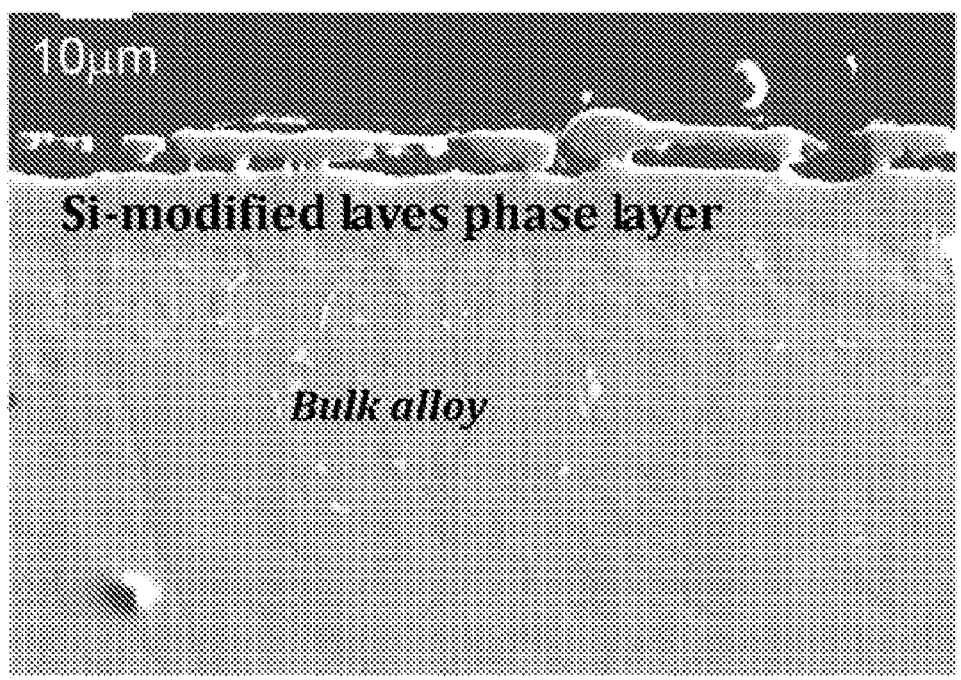
FIG. 5 shows a scanned image of a cross-section through a Nb-based substrate having a chromium coating similar to FIG. 4 but after heat treatment in accordance with an embodiment of the invention.

FIG. 4 is a scanned image showing one of the coated specimens prior to heat treatment. In FIG. 4, the substantially pure chromium layer is clearly seen. FIG. 5 is a scanned image showing one of the coated specimens following heat treatment. Electron microprobe analysis of the coating showed the overlay region of the coating to contain more than 94 weight percent chromium at its surface, with titanium, silicon, and niobium also present especially near the substrate interface. Aluminum, tungsten and hafnium were also present in minor quantities. A diffusion zone directly underneath the overlay region was almost entirely composed of a silicon-modified $Cr_2Nb$ Laves phase having an average composition of, by weight, about 59Cr-20Nb-11Ti-8Si-2Hf, plus trace amounts of Al and Sn.

Figure 6:
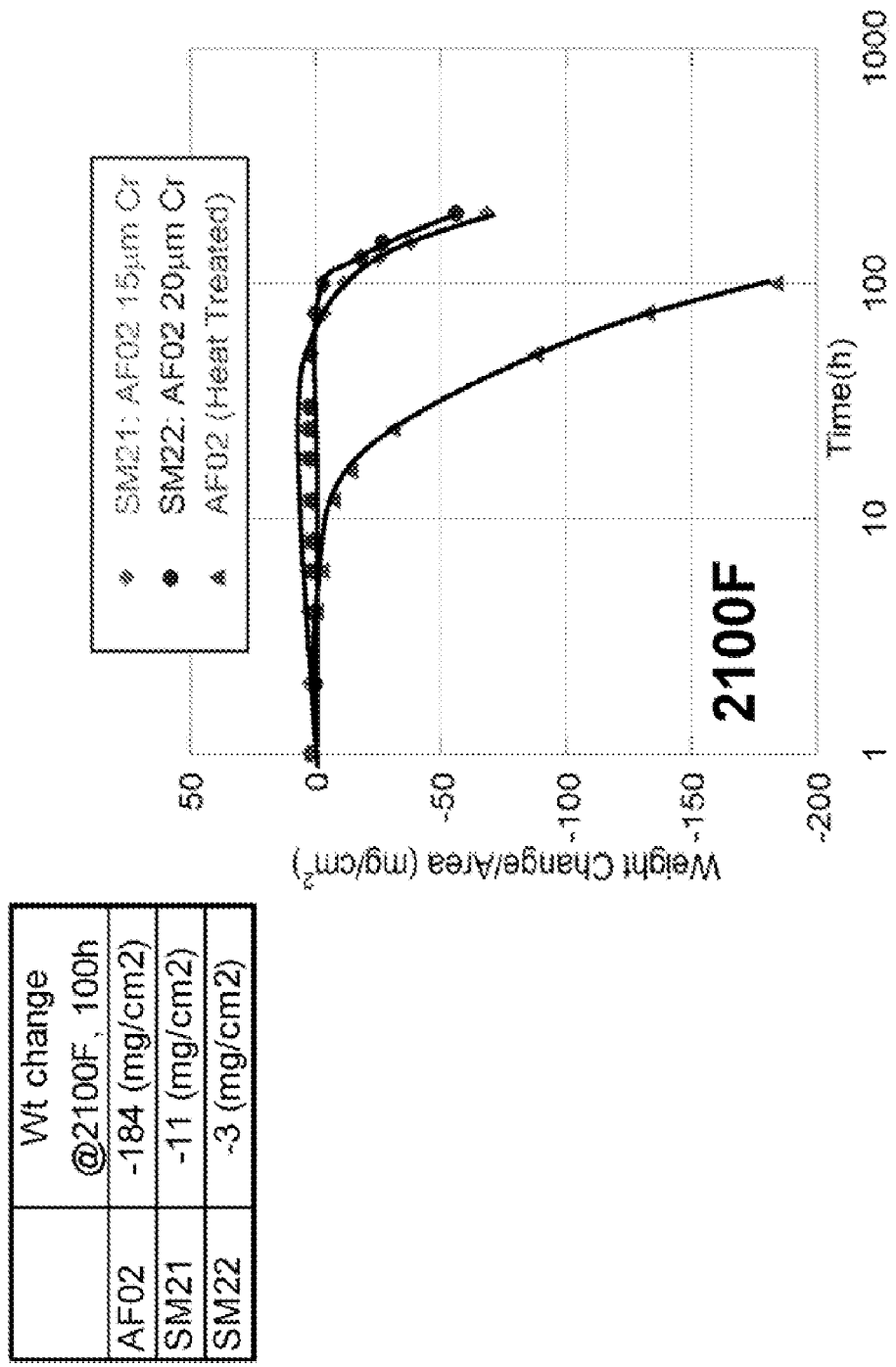
FIG. 6 is a graph plotting the oxidation performance of an uncoated Nb-based substrate and two Nb-based substrates protected by diffused chromium coatings similar to that of FIG. 5.

Results of the oxidation test are graphically represented in FIG. 6. The weight loss data in FIG. 6 clearly show a drastic improvement of the coated specimens over the uncoated baseline specimen. The silicon-modified $Cr_2Nb$ Laves phase was consumed to produce a continuous complex oxide scale that protected their substrates. The oxidation test evidenced that the coated specimens were substantially better at preventing oxidation ingress into the bulk alloy substrate, as evidenced by the formation of hafnia in the bulk alloy. Overall, substrate life was improved by a factor of more than five over the baseline specimen.

From the investigation, it is believed that suitable thicknesses for coatings 20 formed of Composition A are about 5 to about 200 micrometers, more preferably about 8 to about 100 micrometers.

A second composition (Composition B) for the coating 20 is specifically formulated to exhibit significantly fewer cracks than the conventional Si-based coatings (Si—Cr—Ti and Si—Cr—Fe), and more specifically fewer vertical cracks—cracks that extend through the coating in a direction that is roughly perpendicular to the interface between the coating 20 and the underlying surface region 18—with the result that improved oxidation resistance is achieved by reducing pathways for oxidants to the surface region 18. The coating 20 relies in part on the creation of solid solution phases with lower CTE values than phases present in the Si—Cr—Ti and Si—Cr—Fe coatings, and therefore reduce the CTE of the coating 20 to something closer to a Nb-based substrate. Specifically, the coating 20 is formulated to contain at least two lower-CTE silicide phases, specifically, $M_5Si_3$, $M_3Si_2$, and/or $MSi_2$, notable examples of which include but are not limited to the following silicides: $Mo_5Si_3$ (about 6 ppm/° C.), $MoSi_2$ (about 8.4 ppm/° C.), $WSi_2$ (about 8 ppm/° C.), and $ReSi_2$ (about 8.4 ppm/° C.).

For the $M_5Si_3$, $M_3Si_2$, and $MSi_2$ phases of Composition B, M is preferably molybdenum and optionally one or more of niobium, titanium, chromium, hafnium, iron, rhenium, tantalum, and tungsten. Preferred chemistries for Composition B are capable of reducing vertical cracks to less than five per linear inch, and therefore far fewer than the 100+ vertical cracks per inch typically observed with conventional Si—Cr—Ti and Si—Cr—Fe coatings. When present in proper volume fractions, the phases of Composition B have also been shown to form a continuous, slow-growing oxide scale 26 that contains one or more of the following oxides: chromia, titania, niobia, and silica. The oxide scale 26 is capable of imparting oxidation resistance to the niobium-based surface region 18 (and other niobium-based alloys and composites, especially Nb—Si composites).

Coatings 20 based on Composition B can be formed by directly depositing the coating phases to the substrate using one of the above-noted overlay processes, or by depositing the constituents of the desired phases using one of the overlay processes and then heat treating the constituents under conditions that cause interdiffusion and reactions to form the desired phases. A suitable heat treatment is to hold the coated substrate at a temperature of about 1000° C. to about 1300° C. for a duration of about 0.5 to about 4 hours in a non-oxidizing atmosphere, such as a flowing inert gas (for example, argon), a vacuum, etc. Alternatively, the coating constituents can be deposited using one of the above-noted diffusion processes, by which solid-state or liquid-state diffusion occurs to achieve liquation of one or more of the deposited constituents. A suitable diffusion treatment is to hold the coated substrate at a temperature of about 1300° C. to about 1600° C. for a duration of about 0.5 to about 4 hours in a non-oxidizing atmosphere, such as a flowing inert gas (for example, argon), a vacuum, etc.

The ability of the coating 20 to form a self-sustaining oxide scale 26 is attributed to the types and approximate relative amounts (by volume percent) of preferred phases in the coating 20, as summarized in Table IV below. The upper limits for the preferred ranges are based on only two of the three phases being present in the coating 20.

TABLE IV

| Phases | Broad Ranges | Preferred Ranges | Nominal Values |
|---|---|---|---|
| $M_5Si_3$ | up to 90% | 40 to 80% | 45% |
| $M_3Si_2$ | up to 90% | 40 to 80% | 45% |
| $MSi_2$ | up to 50% | 10 to 40% | 10% |

Approximate chemistries (by atomic percent) of the above phases are summarized in Table V below.

TABLE V

| Constituents | $M_5Si_3$ Broad | $M_5Si_3$ Preferred | $M_3Si_2$ Broad | $M_3Si_2$ Preferred | $MSi_2$ Broad | $MSi_2$ Preferred |
|---|---|---|---|---|---|---|
| Molybdenum | 10-60 | 10-40 | 10-50 | 10-40 | 10-30 | 20-30 |
| Silicon | 32-40 | 35-40 | 35-45 | 38-42 | 60-70 | 64-68 |
| Aluminum | 0-10 | 0-5 | 0-10 | 0-5 | 0-10 | 0-5 |
| Chromium | 0-30 | 0-20 | 0-30 | 0-20 | 0-10 | 0-5 |
| Iron | 0-20 | 0-10 | 0-20 | 0-10 | 0-10 | 0-5 |
| Hafnium | 0-20 | 0-10 | 0-20 | 0-10 | 0-10 | 0-2.5 |
| Niobium | 0-50 | 0-30 | 0-40 | 0-30 | 0-15 | 0-10 |
| Titanium | 0-30 | 0-20 | 0-30 | 0-20 | 0-15 | 0-5 |
| Zirconium | 0-20 | 0-10 | 0-30 | 0-10 | 0-10 | 0-5 |
| Yttrium | 0-10 | 0-5 | 0-10 | 0-5 | 0-10 | 0-5 |
| Tungsten | 0-10 | 0-5 | 0-10 | 0-5 | 0-10 | 0-5 |
| Tantalum | 0-20 | 0-10 | 0-20 | 0-10 | 0-10 | 0-5 |
| Rhenium | 0-10 | 0-5 | 0-10 | 0-5 | 0-10 | 0-5 |

From Table V, it can be seen that a minimum molybdenum content of coatings 20 based on Composition B is about ten atomic percent. Broad and more preferred ranges for molybdenum are generally about 10 to 60 atomic percent, about 20 to 50 atomic percent, and about 30 to 40 atomic percent.

In an investigation leading to Composition B, Nb—Si composite specimens with different Mo-based coating compositions were prepared and evaluated. A baseline specimen was slurry coated with the known R512E (about 60Si-20Cr-20Fe weight percent, about 74Si-13Cr-13Fe molar percent) coating composition. One surface of each remaining specimen was coated with a coating composition based on R512E but modified to further contain molybdenum. All Mo-modified coatings were deposited by IPD. Some of the specimens with the Mo-modified coatings were set aside for chemical analysis, while others (including the baseline R512E specimen) were designated for an oxidation test. To protect their uncoated surfaces, the surfaces of the oxidation specimens opposite the IPD-coated surfaces were slurry coated with the R512E coating composition. All coatings had a thickness of about thirty micrometers. Following coating, all of the specimens underwent an interdiffusion treatment at about 1400° C. for about one hour. The oxidation specimens then underwent an oxidation test conducted at about 1150° C. for a duration of about 100 hours.

Figure 3:
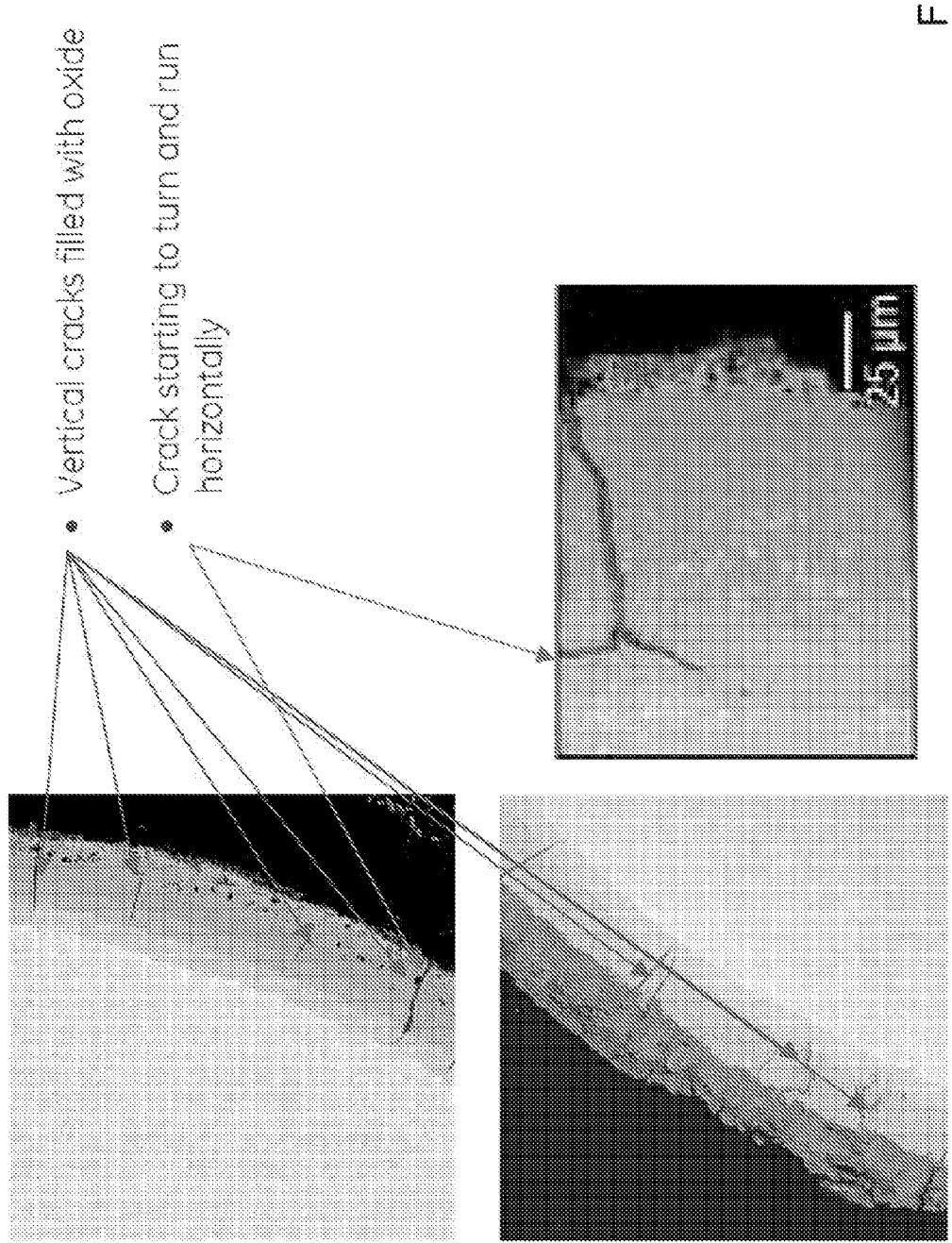
FIG. 3 shows three scanned images of cross-sections through a Nb-based substrate coated with a prior art Si—Cr—Fe silicide coating.

As deposited, the Mo-modified coatings were found to be crack-free, whereas the R512E coating was found to have vertical cracks (FIG. 3). Three of the Mo-modified coatings that underwent chemical analysis were determined to have molybdenum contents of about 25, about 35, and about 45 atomic percent, respectively, which assuming the R512E base material had a composition of about 60Si-20Cr-20Fe by weight (about 74Si-13Cr-13Fe molar percent), would correspond to coating compositions of, by molar percent, roughly 56Si-10Cr-9Fe-25Mo, 48Si-9Cr-8Fe-35Mo, and 41Si-7Cr-7Fe-45Mo, respectively. Each coating remained crack-free following the thermal treatment, with considerable porosity being evident. In comparing the 25% Mo and 35% Mo coatings, the molybdenum contents of both were found to extend about twenty-five to thirty micrometers from the coating surface, and the 35% Mo specimen had a maximum molybdenum content near its surface of about 45 atomic percent as compared to about 33 atomic percent for the 25% Mo specimen. Furthermore, the outer surface of the 25% Mo specimen was predominantly $MoSi_2$ intermetallic, whereas the remainder of the coating and the majority of the 35% Mo coating was predominantly $(Nb,Ti,Fe,Cr,Mo)_5Si_3$ intermetallic. Electron microprobe analysis of the 25% Mo specimen showed the $MoSi_2$-dominated surface region of the coating contained, by weight, about 43.1 Si-33.9Mo-11.9Cr-7.0Fe-2.7Ti-0.7Nb-0.5Al-0.2Hf-0.1W, and the $(Nb,Ti,Fe,Cr,Mo)_5Si_3$ subsurface region contained relatively increasing amounts of niobium and titanium, relatively decreasing amounts of molybdenum and chromium, and roughly the same amounts of the remaining coating constituents.

Figure 7:
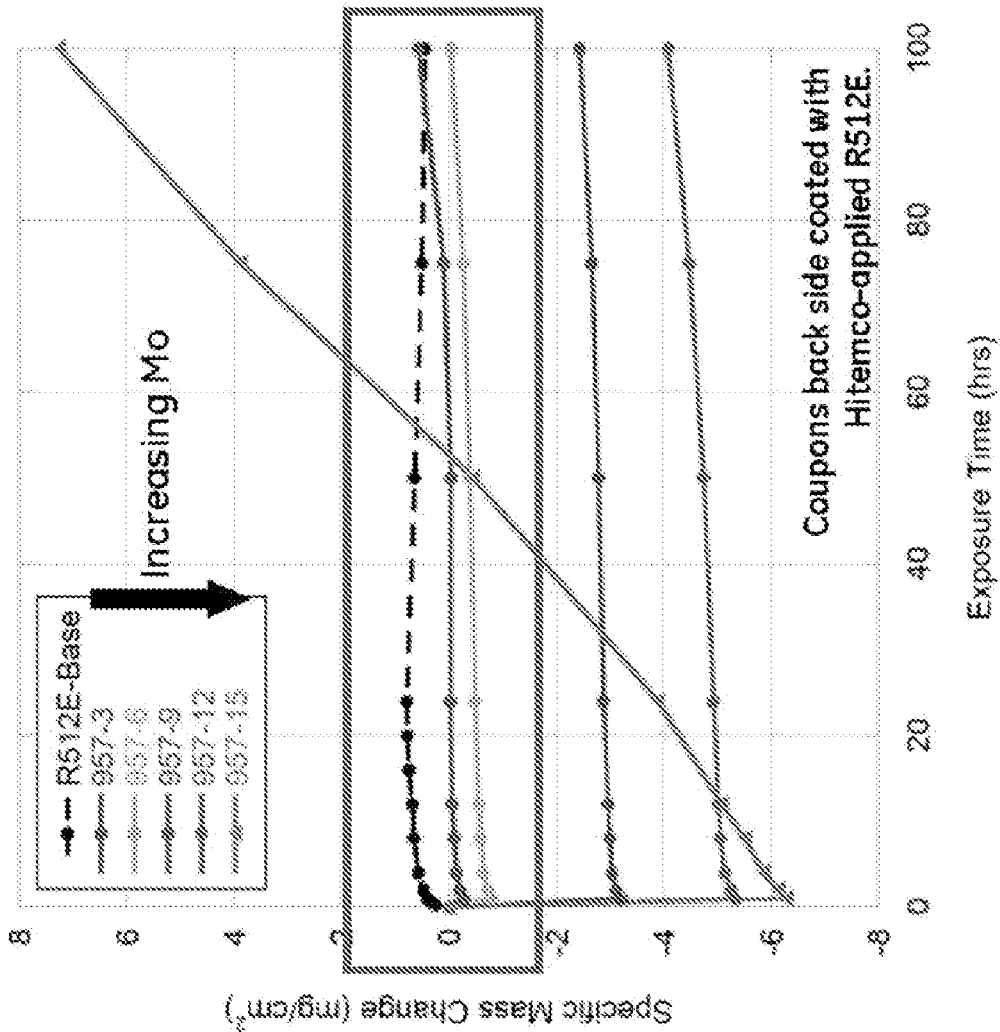
FIG. 7 is a graph plotting the oxidation performance of Nb-based substrates protected by a baseline coating and by diffused Mo—Si—Cr—Fe coatings in accordance with embodiments of the invention.

Results of the oxidation test performed on the baseline Mo-free R512E specimen and five Mo-modified specimens (957-3, 957-6, 957-9, 957-12, and 957-15) are graphically represented in FIG. 7. The 957-3, 957-6, 957-9, 957-12, and 957-15 specimens contained increasing Mo contents of about 25, about 35, about 45, about 55, and about 65 atomic percent, respectively. The weight change data in FIG. 7 evidences that the 957-3 and 957-6 specimens exhibited similar oxidation performance to the baseline R512E specimen, though high molybdenum contents resulted in appreciably poorer oxidation performance. The most important difference between the 957-3 and 957-6 specimens and the baseline R512E specimen was the absence of vertical cracks in the 957-3 and 957-6 specimens, enabling the latter two coatings to provide superior oxidation resistance over time.

From the investigation, it is believed that suitable thicknesses for coatings 20 formed of Composition B are about 5 to about 200 micrometers, more preferably about 25 to about 100 micrometers.

While the invention has been described in terms of certain embodiments, it is apparent that other forms could be adopted by one skilled in the art. Therefore, the scope of the invention is to be limited only by the following claims.

The invention claimed is:

1. A coating capable of promoting the oxidation resistance of a surface of a niobium-based substrate, wherein the coating is formed from: a composition that contains, in atomic percent, about 31 to about 99% chromium, about 1 to about 37% silicon, and about 0 to about 40% niobium+titanium+hafnium+iron where titanium, hafnium and iron are optional, and wherein the coating comprises at least about 72 volume percent of silicon-modified $Cr_2Nb$ Laves phase, up to about 28 volume percent of chromium solid solution, up to about 28 volume percent of CrNbSi intermetallic phase, and up to about 25 volume percent of $M_3Si$ intermetallic phase, wherein M is selected from at least one of niobium, titanium, and chromium.

2. The coating according to claim 1, wherein the coating has an oxide scale on a surface thereof that is a complex oxide containing chromia, titania, niobia, and silica.

3. The coating according to claim 1, wherein the coating contains hafnium.

4. The coating according to claim 1, wherein the coating is on the surface of the niobium-based substrate, and the niobium-based substrate has a composition consisting of, by weight, up to 5% aluminum, up to 1% carbon, up to 5% cobalt, up to 20% chromium, up to 5% iron, up to 10% hafnium, up to 3% manganese, up to 15% molybdenum, up to 0.2% silicon, up to 30% tantalum, up to 20% titanium, up to 8% vanadium, up to 15% tungsten, and up to 10% zirconium, up to 5% of a rare earth element, up to 25% of a platinum group metal, the balance niobium and incidental impurities.

5. The coating according to claim 4, wherein the substrate is a component of a gas turbine engine.

6. The coating according to claim 1, wherein the coating is on the surface of the niobium-based substrate, and the niobium-based substrate is formed of a material containing a silicide reinforcement material dispersed in a niobium-based matrix.

7. The coating according to claim 6, wherein the substrate is a component of a gas turbine engine.

8. A gas turbine engine component comprising: a substrate formed of a niobium-based alloy or a niobium-silicide composite;
    a coating on the substrate and capable of promoting the oxidation resistance of a surface of the substrate; and
    an oxide scale on a surface of the coating;
    wherein the coating is formed from a composition that contains, in atomic percent, about 31 to about 99% chromium, about 1 to about 37% silicon, and about 0 to about 40% niobium+titanium+hafnium+iron where titanium, hafnium and iron are optional, and wherein the coating comprises at least about 72 volume percent of silicon modified $Cr_2Nb$ Laves phase, up to about 28 volume percent of chromium solid solution, up to about 28 volume percent of CrNbSi intermetallic phase, and up to about 25 volume percent of $M_3Si$ intermetallic phase, wherein M is selected from at least one of niobium, titanium, and chromium.

9. The gas turbine engine component according to claim 8, wherein the coating contains hafnium.

* * * * *